United States Patent
Kamioka et al.

(10) Patent No.: US 12,456,954 B2
(45) Date of Patent: Oct. 28, 2025

(54) HIGH-FREQUENCY AMPLIFIER, RADIO COMMUNICATION DEVICE, AND RADAR DEVICE

(71) Applicant: Mitsubishi Electric Corporation, Tokyo (JP)

(72) Inventors: Jun Kamioka, Tokyo (JP); Shintaro Shinjo, Tokyo (JP)

(73) Assignee: MITSUBISHI ELECTRIC CORPORATION, Tokyo (JP)

(*) Notice: Subject to any disclaimer, the term of this patent is extended or adjusted under 35 U.S.C. 154(b) by 540 days.

(21) Appl. No.: 17/882,105

(22) Filed: Aug. 5, 2022

(65) Prior Publication Data

US 2022/0385246 A1 Dec. 1, 2022

Related U.S. Application Data

(63) Continuation of application No. PCT/JP2020/015343, filed on Apr. 3, 2020.

(51) Int. Cl.
  *H03F 3/193* (2006.01)
(52) U.S. Cl.
  CPC ....... *H03F 3/193* (2013.01); *H03F 2200/451* (2013.01)
(58) Field of Classification Search
  CPC .......... H03F 3/193; H03F 3/245; H03F 3/195; H03F 2200/451; H03F 1/223;

(Continued)

(56) References Cited

U.S. PATENT DOCUMENTS

| | | | |
|---|---|---|---|
| 2007/0046379 A1* | 3/2007 | Tanahashi | H03F 1/223 330/311 |
| 2015/0340997 A1 | 11/2015 | Kato et al. | |
| 2020/0076378 A1* | 3/2020 | Minami | H03F 3/193 |

FOREIGN PATENT DOCUMENTS

| | | |
|---|---|---|
| JP | 2004-235290 A | 8/2004 |
| WO | WO 2014/073091 A1 | 5/2014 |

OTHER PUBLICATIONS

Extended European Search Report for European Application No. 20928877.8, dated Jul. 5, 2023.

(Continued)

*Primary Examiner* — Andrea Lindgren Baltzell
*Assistant Examiner* — Nareh Shamiryan
(74) *Attorney, Agent, or Firm* — Birch, Stewart, Kolasch & Birch, LLP (57) ABSTRACT

A high-frequency amplifier includes: a common-source transistor that has gate fingers, drain fingers, and source fingers, amplifies a signal applied to each of the gate fingers as a signal to be amplified, and outputs an amplified signal from each of the drain fingers; a common-gate transistor that has source fingers connected to the drain fingers of the common-source transistor, drain fingers, and gate fingers, and amplifies the amplified signal output from each of the drain fingers of the common-source transistor; a gate bus bar connected to the gate fingers of the common-gate transistor; and capacitors each having a first end connected to the gate bus bar and a second end grounded: wherein the capacitors are arranged at respective positions where impedances obtained by looking toward the respective capacitors from the respective gate fingers of the common-gate transistor are equal to each other.

7 Claims, 9 Drawing Sheets

(58) Field of Classification Search
CPC ............... H01L 23/481; H01L 23/4821; H01L 23/4824; H01L 23/5223; H01L 23/66; H02K 15/90; H10D 12/01
USPC ................................................ 330/291, 311
See application file for complete search history.

(56) References Cited

OTHER PUBLICATIONS

European Communication pursuant to Article 94(3) EPC for European Application No. 20928877.8, dated Apr. 8, 2024.

* cited by examiner

HIGH-FREQUENCY AMPLIFIER, RADIO COMMUNICATION DEVICE, AND RADAR DEVICE

CROSS REFERENCE TO RELATED APPLICATIONS

This application is a Continuation of PCT International Application No. PCT/JP2020/015343, filed on Apr. 3, 2020, which is hereby expressly incorporated by reference into the present application.

TECHNICAL FIELD

The present disclosure relates to a high-frequency amplifier that amplifies a signal, a radio communication device including the high-frequency amplifier, and a radar device including the high-frequency amplifier.

BACKGROUND ART

In some cases, the radio communication device and the radar device each include a high-frequency amplifier that amplifies a high-frequency signal. The high-frequency amplifier includes, for example, a common-source multi-finger field effect transistor (FET), and the common-source FET amplifies a high-frequency signal.

An output power of the high-frequency amplifier increases with an increase in voltage applied to the drain of the FET. However, since the FET has a withstand voltage, the drain voltage of the FET is limited.

Patent Literature 1 below discloses a high-frequency amplifier in which a drain of a common-source FET is connected to a source of a common-gate FET whose gate is grounded via a capacitor.

In the high-frequency amplifier disclosed in Patent Literature 1, a plurality of gate fingers included in the common-gate FET are bundled by a gate bus bar. One end of the capacitor is connected to the gate bus bar, and the other end of the capacitor is grounded.

CITATION LIST

Patent Literature

Patent Literature 1: WO 2014-073091

SUMMARY OF INVENTION

Technical Problem

In a high-frequency amplifier disclosed in Patent Literature 1, if the capacitance value of a capacitor is appropriately set, there is a possibility that a voltage twice as high as that of a high-frequency amplifier including only one common-source FET can be applied to the drain of the common-source FET.

However, in the high-frequency amplifier disclosed in Patent Literature 1, the distances from the respective gate fingers of the common-gate FET to the capacitor are different from each other, and thus parasitic components between the respective gate fingers and common-gate capacitance are different from each other. Since the parasitic components between the respective gate fingers and the common-gate capacitance are different from each other, there is an imbalance between the amplification operations of the respective gate fingers. Since there is an imbalance between the amplification operations of the respective gate fingers, the combined loss of high-frequency signals amplified by the gate fingers increases, so that there is a problem that the output power decreases.

The present disclosure has been made to solve the above problems, and an object of the present disclosure is to obtain a high-frequency amplifier capable of suppressing an imbalance between amplification operations of a plurality of gate fingers.

Solution to Problem

A high-frequency amplifier according to the present disclosure includes: a common-source transistor that has a plurality of gate fingers, a plurality of drain fingers, and a plurality of source fingers, amplifies a signal applied to each of the gate fingers as a signal to be amplified, and outputs an amplified signal from each of the drain fingers; a common-gate transistor that has a plurality of source fingers connected to the drain fingers of the common-source transistor, a plurality of drain fingers, and a plurality of gate fingers, and amplifies the amplified signal output from each of the drain fingers of the common-source transistor; a gate bus bar connected to the gate fingers of the common-gate transistor, and a plurality of capacitors each having a first end connected to the gate bus bar and a second end grounded, wherein the capacitors are arranged at respective positions where impedances obtained by looking toward the respective capacitors from the respective gate fingers of the common-gate transistor are equal to each other.

Advantageous Effects of Invention

According to the present disclosure, the high-frequency amplifier is configured in such a way that the capacitors are arranged at respective positions where the impedances obtained by looking toward the capacitors from the respective gate fingers of the common-gate transistor are equal to each other. As a result, the high-frequency amplifier according to the present disclosure can reduce the imbalance between the amplification operations of the gate fingers.

DESCRIPTION OF EMBODIMENTS

Hereinafter, in order to describe the present disclosure in more detail, modes for carrying out the present disclosure will be described with reference to the accompanying drawings.

First Embodiment

Figure 1:
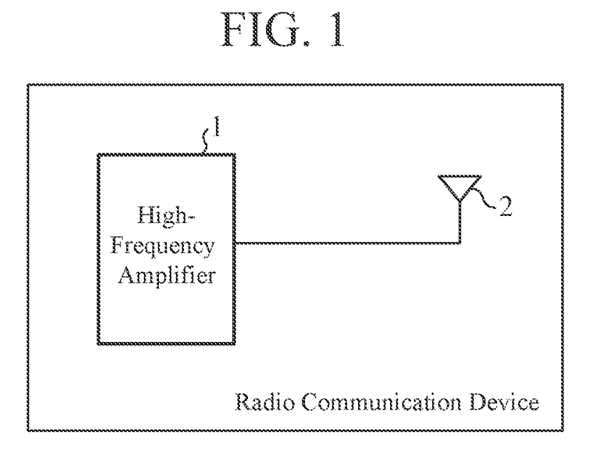
FIG. 1 is a configuration diagram illustrating a radio communication device including a high-frequency amplifier 1 according to a first embodiment.

FIG. 1 is a configuration diagram illustrating a radio communication device including a high-frequency amplifier 1 according to a first embodiment.

The high-frequency amplifier 1 included in the radio communication device illustrated in FIG. 1 amplifies a high-frequency signal as a signal to be amplified, and outputs the amplified high-frequency signal to a transmission antenna 2.

The transmission antenna 2 radiates a radio wave related to the high-frequency signal output from the high-frequency amplifier 1 into space.

Figure 2:
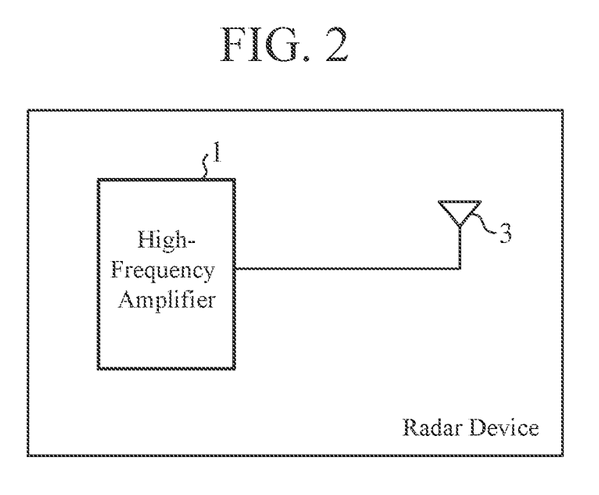
FIG. 2 is a configuration diagram illustrating a radar device including the high-frequency amplifier 1 according to the first embodiment.

FIG. 2 is a configuration diagram illustrating a radar device including the high-frequency amplifier 1 according to the first embodiment.

The high-frequency amplifier 1 included in the radar device illustrated in FIG. 2 amplifies a radar signal as a signal to be amplified, and outputs the amplified radar signal to a transmission antenna 3.

The transmission antenna 3 radiates a radio wave related to the radar signal output from the high-frequency amplifier 1 into space.

Figure 3:
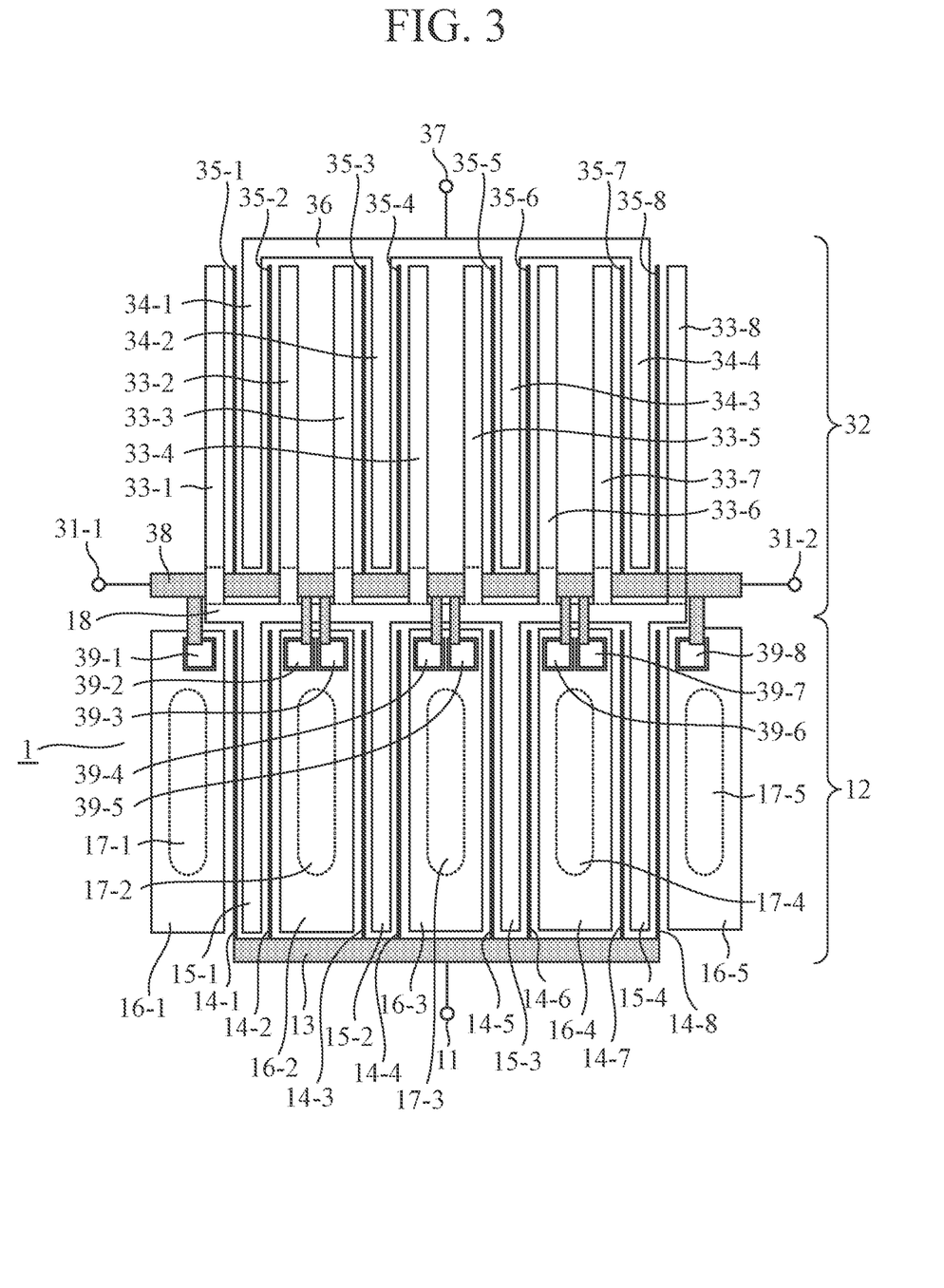
FIG. 3 is a configuration diagram illustrating the high-frequency amplifier 1 according to the first embodiment.

FIG. 3 is a configuration diagram illustrating the high-frequency amplifier 1 according to the first embodiment.

Figure 4:
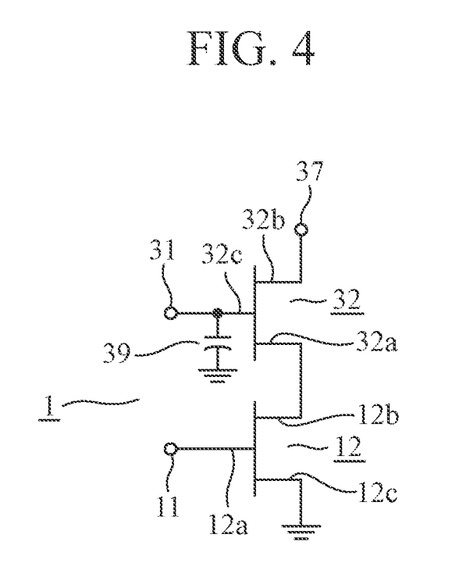
FIG. 4 is an equivalent circuit diagram illustrating the high-frequency amplifier 1 according to the first embodiment.

FIG. 4 is an equivalent circuit diagram illustrating the high-frequency amplifier 1 according to the first embodiment.

A signal input terminal 11 is a terminal to which a high-frequency signal, a radar signal, or a reception signal is applied as a signal to be amplified, from the outside. Here, for the convenience of description, it is assumed that a high-frequency signal is applied to the signal input terminal 11.

In the high-frequency amplifier 1 illustrated in FIG. 3, although not illustrated, the signal input terminal 11 is connected to an input-side matching circuit.

A common-source transistor 12 includes a gate electrode 12a, a drain electrode 12b, and a source electrode 12c.

The gate electrode 12a of the common-source transistor 12 is connected to the signal input terminal 11.

The drain electrode 12b of the common-source transistor 12 is connected to a source electrode 32a of a common-gate transistor 32 to be described later.

The source electrode 12c of the common-source transistor 12 is connected to the ground.

The common-source transistor 12 amplifies a high-frequency signal applied to the gate electrode 12a, and outputs the amplified high-frequency signal from the drain electrode 12b to the source electrode 32a of the common-gate transistor 32.

As the common-source transistor 12, for example, a GaN multi-finger transistor made of gallium nitride (GaN) formed on a monolithic microwave integrated circuit (MMIC) is used.

The gate electrode 12a includes a gate bus bar 13 and gate fingers 14-1 to 14-8.

In the high-frequency amplifier 1 illustrated in FIG. 3, the gate electrode 12a includes eight gate fingers 14-1 to 14-8. However, the gate electrode 12a is only required to have a plurality of gate fingers 14, and is not limited to a gate electrode having the eight gate fingers 14-1 to 14-8.

The gate bus bar 13 is connected to the signal input terminal 11.

One end of each of the gate fingers 14-1 to 14-8 is connected to the gate bus bar 13.

The drain electrode 12b includes drain fingers 15-1 to 15-4.

The drain finger 15-1 is disposed between the gate finger 14-1 and the gate finger 14-2 in parallel with each of the gate fingers 14-1 and 14-2.

The drain finger 15-2 is disposed between the gate finger 14-3 and the gate finger 14-4 in parallel with each of the gate fingers 14-3 and 14-4.

The drain finger 15-3 is disposed between the gate finger 14-5 and the gate finger 14-6 in parallel with each of the gate fingers 14-5 and 14-6.

The drain finger 15-4 is disposed between the gate finger 14-7 and the gate finger 14-8 in parallel with each of the gate fingers 14-7 and 14-8.

The source electrode 12c includes source fingers 16-1 to 16-5.

The source finger 16-$n$ ($n$=1, 2, 3, 4, and 5) is a source electrode with an individual source via (ISV) structure having a via hole 17-$n$.

The source finger 16-1 is disposed on the left of the gate finger 14-1 in FIG. 3 in parallel with the gate finger 14-1.

The source finger 16-2 is disposed between the gate finger 14-2 and the gate finger 14-3 in parallel with each of the gate fingers 14-2 and 14-3.

The source finger 16-3 is disposed between the gate finger 14-4 and the gate finger 14-5 in parallel with each of the gate fingers 14-4 and 14-5.

The source finger 16-4 is disposed between the gate finger 14-6 and the gate finger 14-7 in parallel with each of the gate fingers 14-6 and 14-7.

The source finger 16-5 is disposed on the right of the gate finger 14-8 in FIG. 3 in parallel with the gate finger 14-8.

One end of the via hole 17-$n$ is connected to the source finger 16-$n$, and the other end of the via hole 17-$n$ is connected to the ground.

A bus bar 18 is connected to the drain fingers 15-1 to 15-4 of the common-source transistor 12, and is also connected to source fingers 33-1 to 33-8 of the common-gate transistor 32.

Agate terminal 31 includes gate terminals 31-1 and 31-2.

The gate terminal 31 is a terminal to which a gate bias is applied.

Each of the gate terminals 31-1 and 31-2 is connected to a gate bus bar 38 to be described later.

The common-gate transistor 32 includes the source electrode 32a, a drain electrode 32b, and a gate electrode 32c.

The source electrode 32a of the common-gate transistor 32 is connected to the drain electrode 12b of the common-source transistor 12.

The drain electrode 32b of the common-gate transistor 32 is connected to a signal output terminal 37 to be described later.

The gate electrode 32c of the common-gate transistor 32 is connected to the gate terminal 31 and a capacitor 39. The capacitor 39 is any one of capacitors 39-1 to 39-8 to be described later.

The common-gate transistor 32 amplifies a high-frequency signal output from the drain electrode 12b of the common-source transistor 12, and outputs the amplified high-frequency signal from the drain electrode 32b to the signal output terminal 37.

As the common-gate transistor 32, for example, a GaN multi-finger transistor made of GaN formed on the MMIC is used.

The source electrode 32a includes the source fingers 33-1 to 33-8.

One end of each of the source fingers 33-1 to 33-8 is connected to the bus bar 18.

The drain electrode 32b includes drain fingers 34-1 to 34-4.

One end of each of the drain fingers 34-1 to 34-4 is connected to a drain bus bar 36 to be described later.

The drain finger 34-1 is disposed between a gate finger 35-1 to be described later and a gate finger 35-2 to be described later in parallel with each of the gate fingers 35-1 and 35-2.

The drain finger 34-2 is disposed between a gate finger 35-3 to be described later and a gate finger 35-4 to be described later in parallel with each of the gate fingers 35-3 and 35-4.

The drain finger 34-3 is disposed between a gate finger 35-5 to be described later and a gate finger 35-6 to be described later in parallel with each of the gate fingers 35-5 and 35-6.

The drain finger 34-4 is disposed between a gate finger 35-7 to be described later and a gate finger 35-8 to be described later in parallel with each of the gate fingers 35-7 and 35-8.

The gate electrode 32c includes the gate fingers 35-1 to 35-8.

One end of each of the gate fingers 35-1 to 35-8 is connected to the gate bus bar 38.

The gate finger 35-1 is disposed between the source finger 33-1 and the drain finger 34-1 in parallel with each of the source finger 33-1 and the drain finger 34-1.

The gate finger 35-2 is disposed between the drain finger 34-1 and the source finger 33-2 in parallel with each of the drain finger 34-1 and the source finger 33-2.

The gate finger 35-3 is disposed between the source finger 33-3 and the drain finger 34-2 in parallel with each of the source finger 33-3 and the drain finger 34-2.

The gate finger 35-4 is disposed between the drain finger 34-2 and the source finger 33-4 in parallel with each of the drain finger 34-2 and the source finger 33-4.

The gate finger 35-5 is disposed between the source finger 33-5 and the drain finger 34-3 in parallel with each of the source finger 33-5 and the drain finger 34-3.

The gate finger 35-6 is disposed between the drain finger 34-3 and the source finger 33-6 in parallel with each of the drain finger 34-3 and the source finger 33-6.

The gate finger 35-7 is disposed between the source finger 33-7 and the drain finger 34-4 in parallel with each of the source finger 33-7 and the drain finger 34-4.

The gate finger 35-8 is disposed between the drain finger 34-4 and the source finger 33-8 in parallel with each of the drain finger 34-4 and the source finger 33-8.

The drain bus bar 36 is connected to each of the drain fingers 34-1 to 34-4 and the signal output terminal 37.

The signal output terminal 37 is connected to the drain bus bar 36.

The signal output terminal 37 is a terminal for outputting the high-frequency signal amplified by the common-gate transistor 32 to the outside.

In the high-frequency amplifier 1 illustrated in FIG. 3, although not illustrated, the signal output terminal 37 is connected to an output-side matching circuit.

The gate bus bar 38 is connected to each of the gate terminals 31-1 and 31-2, the gate fingers 35-1 to 35-8, and the capacitors 39-1 to 39-8 to be described later.

One end of each of the capacitors 39-1 to 39-8 is connected to the gate bus bar 38.

The other end of each of the capacitors 39-1 to 39-8 is connected to the ground.

The capacitor 39-1 is provided on the source finger 16-1.

The capacitor 39-2 is provided on the source finger 16-2, and the capacitor 39-3 is also provided on the source finger 16-2.

The capacitor 39-4 is provided on the source finger 16-3, and the capacitor 39-5 is also provided on the source finger 16-3.

The capacitor 39-6 is provided on the source finger 16-4, and the capacitor 39-7 is also provided on the source finger 16-4.

The capacitor 39-8 is provided on the source finger 16-5.

The capacitors 39-1 to 39-8 are arranged at respective positions where impedances obtained by looking toward the capacitor 39 from the respective gate fingers 35-$m$ ($m=1, 2, \ldots, 8$) of the common-gate transistor 32 are equal to each other. The impedance obtained by looking toward the capacitor 39 is a combined impedance obtained by looking toward all the capacitors 39-1 to 39-8.

That is, the capacitors 39-1 to 39-8 are arranged at positions where distances $Lm$ from the respective gate fingers 35-$m$ of the common-gate transistor 32 to one capacitor 39-$m$ related to the respective gate fingers 35-$m$ of the common-gate transistor 32 among the capacitors 39-1 to 39-8 are the same as each other. $L1=L2=L3=L4=L5=L6=L7=L8$.

Among the capacitors 39-1 to 39-8, one related capacitor 39-$m$ is a capacitor that has a correspondence relationship with the gate finger 35-$m$, that is, a capacitor closest to the gate finger 35-$m$. That is, among the capacitors 39-1 to 39-8, the capacitor related to the gate finger 35-$m$ is the capacitor 39-$m$.

In the high-frequency amplifier 1 illustrated in FIG. 3, the capacitors 39-1 to 39-8 are arranged at positions where $L1=L2=L3=L4=L5=L6=L7=L8$.

However, it is only required that the impedances obtained by looking toward the capacitor 39 from the respective gate fingers 35-$m$ are equal to each other within a range that does not cause a practical problem. Therefore, strictly speaking, $L1=L2=L3=L4=L5=L6=L7=L8$ does not need to be satisfied, and a case where the distances $L1$ to $L8$ are substantially equal to each other is also included. The impedance obtained by looking toward the capacitor 39 includes the impedance of the capacitor 39.

Next, an operation of the high-frequency amplifier 1 illustrated in FIG. 3 will be described.

A direct-current drain voltage is applied to the signal output terminal 37 in order to enable both the common-source transistor 12 and the common-gate transistor 32 to operate.

In order to enable the common-source transistor 12 to operate, a direct-current gate voltage is applied to the signal input terminal 11.

Furthermore, in order to enable the common-gate transistor 32 to operate, a direct-current gate voltage is applied to the gate terminal 31, which is one of the gate terminal 31-1 and the gate terminal 31-2.

When a high-frequency signal is applied to the signal input terminal 11 as a signal to be amplified, the high-frequency signal is distributed to the gate fingers 14-1 to 14-8 by the gate bus bar 13.

When the high-frequency signals distributed by the gate bus bar 13 are respectively applied to the gate fingers 14-1 to 14-8, the common-source transistor 12 amplifies each of the high frequency signals.

The common-source transistor 12 then outputs the amplified high-frequency signals to the drain fingers 15-1 to 15-4.

The amplified high-frequency signals output to the drain fingers 15-1 to 15-4 are distributed to the source fingers 33-1 to 33-8 by the bus bar 18.

When the high-frequency signals distributed by the bus bar 18 are respectively applied to the source fingers 33-1 to 33-8, the common-gate transistor 32 amplifies each of the high frequency signals.

The common-gate transistor 32 then outputs the amplified high-frequency signals to the drain fingers 34-1 to 34-4.

The amplified high-frequency signals output to the drain fingers 34-1 to 34-4 are combined by the drain bus bar 36, and the combined high-frequency signal is output to the signal output terminal 37.

When the capacitance of the capacitors 39-1 to 39-8 connected to the gate electrode 32c changes, the voltage amplitude between the gate electrode 32c and the source electrode 32a in the common-gate transistor 32 changes.

In the high-frequency amplifier 1 illustrated in FIG. 3, when a high-frequency signal is applied to the signal input terminal 11, capacitances C1 to C8 of the capacitors 39-1 to 39-8 are set in such a way that the voltage amplitude between the gate electrode 12a and the source electrode 12c in the common-source transistor 12 is equal to the voltage amplitude between the gate electrode 32c and the source electrode 32a. When the capacitances C1 to C8 of the capacitors 39-1 to 39-8 are set as described above, the common-source transistor 12 and the common-gate transistor 32 ideally operate in phase and with the same amplitude.

In the high-frequency amplifier 1 illustrated in FIG. 3, the capacitances C1 to C8 of the capacitors 39-1 to 39-8 are set to C1=C2=C3=C4=C5=C6=C7=C8.

The high-frequency amplifier 1 in a case where the common-source transistor 12 and the common-gate transistor 32 operate in phase and with the same amplitude can apply a drain voltage twice as high as that of a high-frequency amplifier including only one common-source transistor to the signal output terminal 37. Therefore, the high-frequency amplifier 1 in the case of operating in phase and with the same amplitude can obtain output power twice as large as the high-frequency amplifier including only one common-source transistor.

In the high-frequency amplifier disclosed in Patent Literature 1, since the parasitic components of the gate fingers of the common-gate FET are different from each other, there is an imbalance between the amplification operations of the gate fingers.

Figure 5:
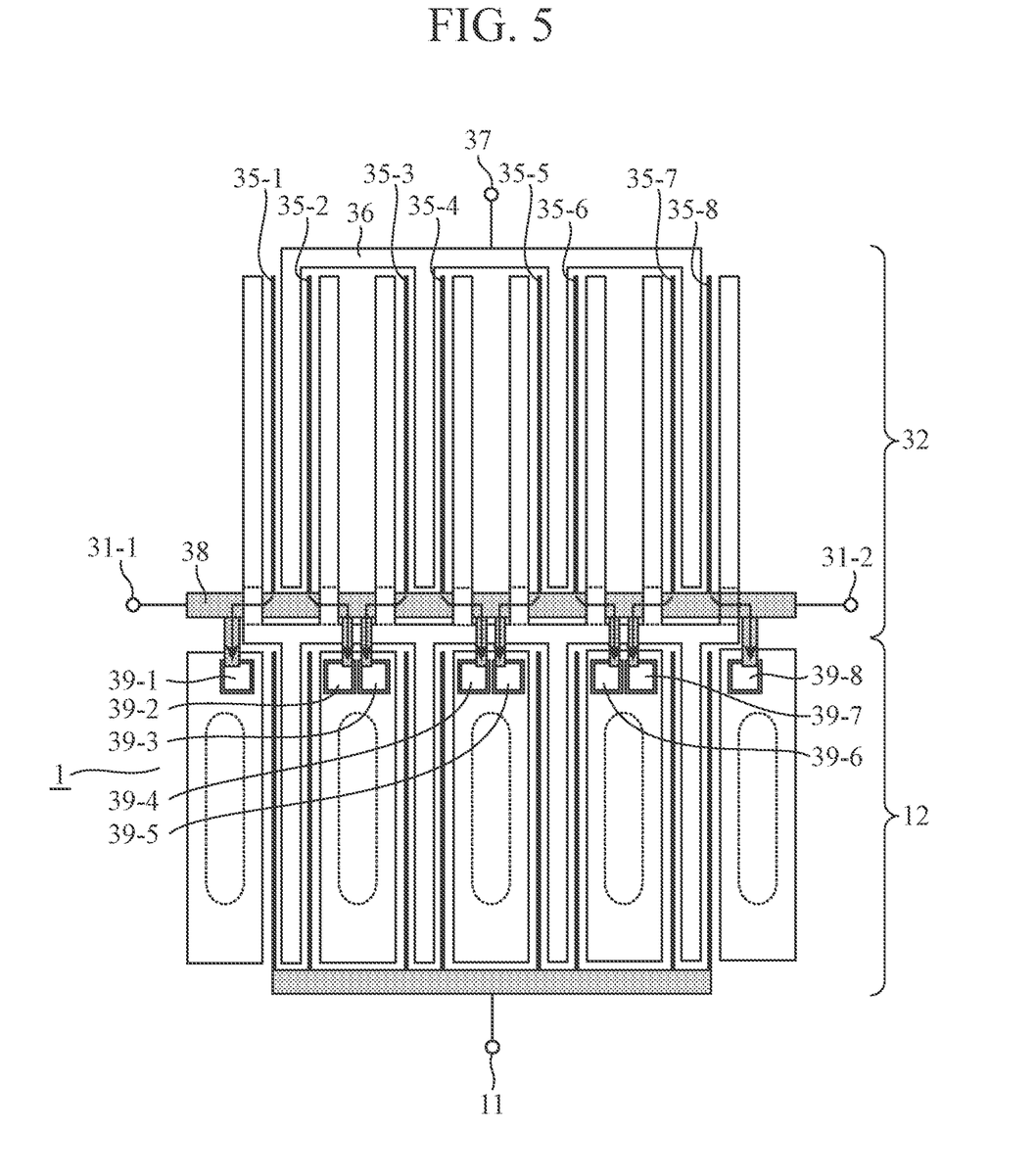
FIG. 5 is an explanatory diagram illustrating impedances each obtained by looking toward a capacitor 39-$m$ from a gate finger 35-$m$ ($m=1, 2, \ldots, 8$).

In the high-frequency amplifier 1 illustrated in FIG. 3, the capacitors 39-1 to 39-8 are arranged at positions where the distances Lm from the gate finger 35-m to the capacitor 39-m are the same as each other. As illustrated in FIG. 5, the impedances obtained by looking toward the capacitor 39-m from the gate finger 35-m are equal to each other.

Therefore, the imbalance between the amplification operations of the gate fingers 35-1 to 35-8 is eliminated. By eliminating the imbalance between the amplification operations, the combined loss of the high-frequency signals amplified by the gate fingers 35-1 to 35-8 is reduced.

FIG. 5 is an explanatory diagram illustrating the impedance each obtained by looking toward the capacitor 39-m from the gate finger 35-m (m=1, 2, . . . , 8). In FIG. 5, an arrow indicates a portion constituting the parasitic impedance between the gate finger 35-m and the capacitor 39-m.

In the high-frequency amplifier 1 illustrated in FIG. 3, the impedances obtained by looking toward the capacitor 39-m from the gate fingers 35-m are substantially equal to each other. However, the impedances obtained by looking toward the capacitor 39-m from the gate fingers 35-m may be shifted from each other within a range that does not cause a practical problem. If each impedance is a shift that causes a phase shift of, for example, about +2° or less with respect to an operation frequency, there is no practical problem.

In the high-frequency amplifier 1 illustrated in FIG. 3, the capacitors 39-1 to 39-8 are connected to the gate bus bar 38. However, this is only an example, and as illustrated in FIG. 6, capacitors 39-1, 39-11, 39-12, 39-13, and 39-8 may be connected to the gate bus bar 38.

Figure 6:
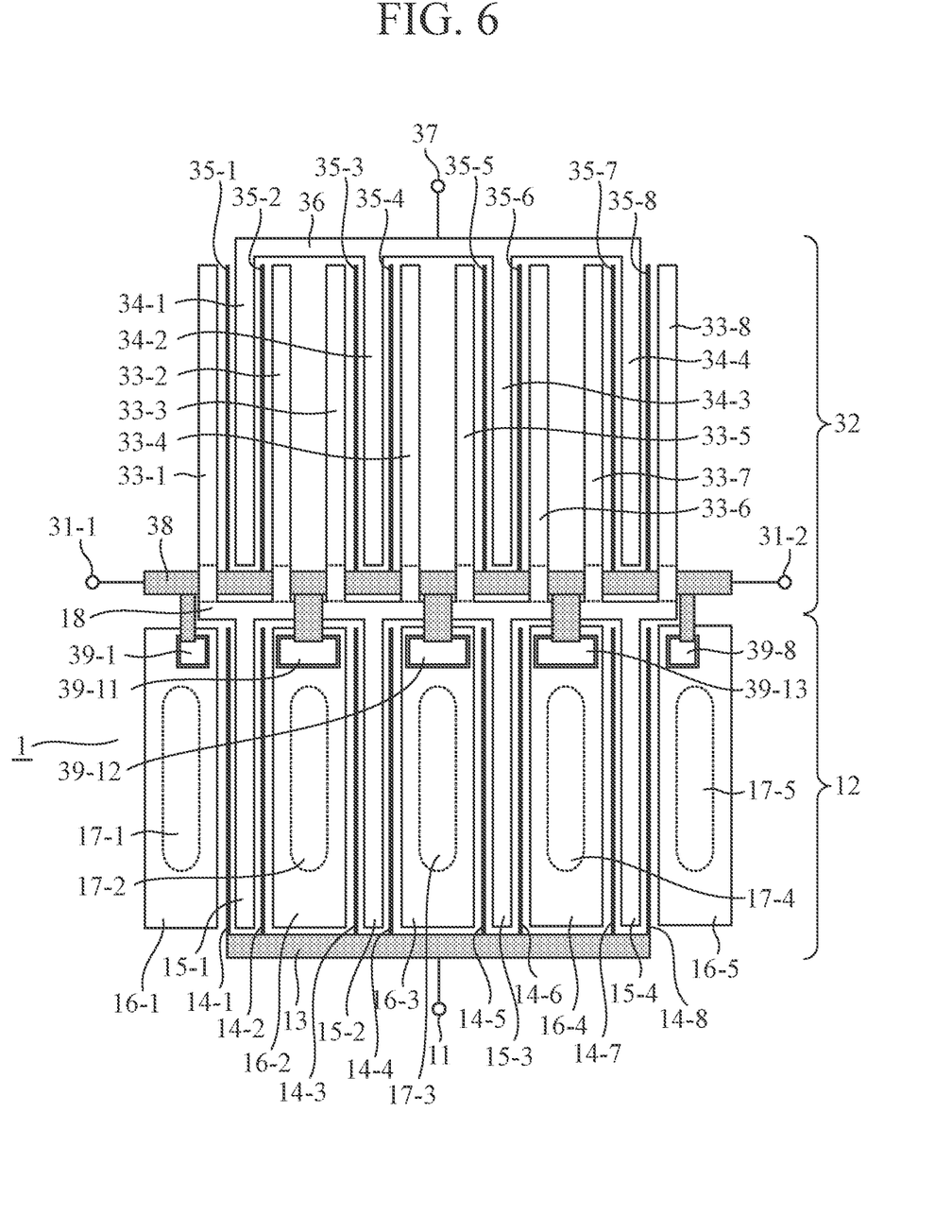
FIG. 6 is a configuration diagram illustrating another high-frequency amplifier 1 according to the first embodiment.

FIG. 6 is a configuration diagram illustrating another high-frequency amplifier 1 according to the first embodiment.

The capacitor 39-11 is a capacitor obtained by combining the capacitor 39-2 and the capacitor 39-3, and is related to each of the gate finger 35-2 and the gate finger 35-3.

The capacitor 39-12 is a capacitor obtained by combining the capacitor 39-4 and the capacitor 39-5, and is related to each of the gate finger 35-4 and the gate finger 35-5.

The capacitor 39-13 is a capacitor obtained by combining the capacitor 39-6 and the capacitor 39-7, and is related to each of the gate finger 35-6 and the gate finger 35-7.

When the capacitance of the capacitor 39-11 is C11, the capacitance of the capacitor 39-12 is C12, and the capacitance of the capacitor 39-13 is C13, the capacitance C1 of the capacitor 39-1 and the capacitance C8 of the capacitor 39-8 are each half the capacitance C11, C12, or C13 as indicated by the following expression (1).

$$C1 = C8 = \frac{C11}{2} = \frac{C12}{2} = \frac{C13}{2} \quad (1)$$

In the high-frequency amplifier 1 illustrated in FIG. 6, the capacitance C1 of the capacitor 39-1 and the capacitance C8 of the capacitor 39-8 are each half the capacitance C11, C12, or C13. However, the capacitance C1 of the capacitor 39-1 and the capacitance C8 of the capacitor 39-8 are not limited to half of the capacitance C11, C12, or C13.

The high-frequency signals provided from the drain fingers 15-1 to 15-4 of the common-source transistor 12 to the source fingers 33-1 to 33-8 of the common-gate transistor 32 may not be completely in phase. In addition, the impedances obtained by looking toward the signal output terminal 37 from the respective gate fingers 35-1 to 35-8 of the common-gate transistor 32 may not be equal to each other.

In these cases, by adjusting the capacitances C1 to C8 of the capacitors 39-1 to 39-8, the imbalance between the amplification operations of the gate fingers 35-1 to 35-8 is eliminated. For example, in a case where the parasitic inductances in the gate finger 35-1 and the gate finger 35-8 are larger than the parasitic inductances in the gate fingers 35-2 to 35-7, the imbalance is eliminated if the capacitance C1 of the capacitor 39-1 and the capacitance C8 of the capacitor 39-8 are made to be smaller than half of the capacitance C11, C12, or C13.

In the first embodiment described above, the high-frequency amplifier 1 includes the common-source transistor 12 that includes the gate fingers 14-1 to 14-8, the drain fingers 15-1 to 15-4, and the source fingers 16-1 to 16-5, amplifies a signal to be amplified applied to each gate finger 14-$m$ ($m$=1, 2, . . . , 8), and outputs the amplified signal from each drain finger 15-$j$ ($j$=1, 2, 3, and 4), and the common-gate transistor 32 that includes the source fingers 33-1 to 33-8 connected to the drain fingers 15-1 to 15-4 of the common-source transistor 12, the drain fingers 34-1 to 34-4, and the gate fingers 35-1 to 35-8, and amplifies the amplified signal output from each drain finger 15-$j$ of the common-source transistor 12. The high-frequency amplifier 1 also includes the gate bus bar 38 connected to the gate fingers 35-1 to 35-8 of the common-gate transistor 32, and the capacitors 39-1 to 39-8 each of which has one end connected to the gate bus bar 38 and the other end grounded. The high-frequency amplifier 1 is configured in such a way that the capacitors 39-1 to 39-8 are arranged at positions where the impedances obtained by looking toward the capacitor 39 from the respective gate fingers 35-$m$ of the common-gate transistor 32 are equal to each other. As a result, the high-frequency amplifier 1 can reduce the imbalance between the amplification operations of the gate fingers 35-1 to 35-8.

In the high-frequency amplifiers 1 illustrated in FIGS. 3 and 6, the common-source transistor 12 and the common-gate transistor 32 are separate transistors.

Figure 7:
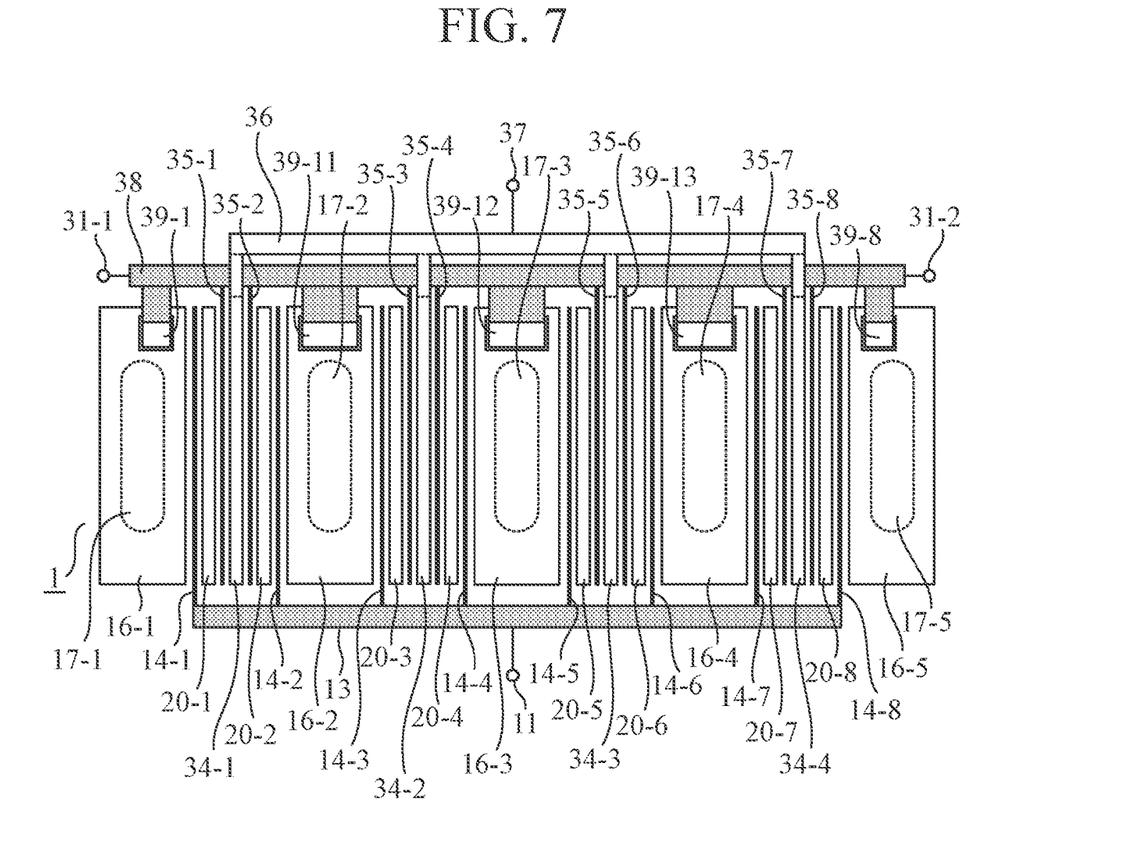
FIG. 7 is a configuration diagram illustrating still another high-frequency amplifier 1 according to the first embodiment.

However, this is only an example, and for example, as illustrated in FIG. 7, it is possible to use a dual gate transistor in which the common-source transistor 12 and the common-gate transistor 32 are implemented in one transistor cell.

FIG. 7 is a configuration diagram illustrating still another high-frequency amplifier 1 according to the first embodiment.

The high-frequency amplifier 1 illustrated in FIG. 7 includes drain source fingers 20-1 to 20-8. The drain source fingers 20-1 to 20-8 are fingers in which the drain fingers 15-1 to 15-4 of the common-source transistor 12 and the source fingers 33-1 to 33-8 of the common-gate transistor 32 are integrated.

In the high-frequency amplifier 1 illustrated in FIG. 7, the gate fingers 14-1 to 14-8, the source fingers 16-1 to 16-5, the drain source fingers 20-1 to 20-8, the drain fingers 34-1 to 34-4, and the gate fingers 35-1 to 35-8 are arranged in parallel with each other.

The high-frequency amplifier 1 illustrated in FIG. 7 includes the capacitors 39-1, 39-8, 39-11, 39-12, and 39-13 similarly to the high-frequency amplifier 1 illustrated in FIG. 6, but may include the capacitors 39-1 to 39-8 similarly to the high-frequency amplifier 1 illustrated in FIG. 3.

When the common-source transistor 12 and the common-gate transistor 32 are implemented as a dual gate transistor, a high-frequency amplifier having a higher frequency or a wider band than the high-frequency amplifiers 1 illustrated in FIGS. 3 and 6 can be implemented.

If the gate of the common-source transistor 12 and the gate of the common-gate transistor 32 are in the same channel, the drain source fingers 20-1 to 20-8 may be omitted.

In the high-frequency amplifier 1 illustrated in FIG. 7, one end of each of the capacitors 39-1, 39-8, 39-11, 39-12, and 39-13 is connected to the gate bus bar 38. Alternatively, one end of each of the capacitors 39-1 to 39-8 is connected to the gate bus bar 38.

Figure 8:
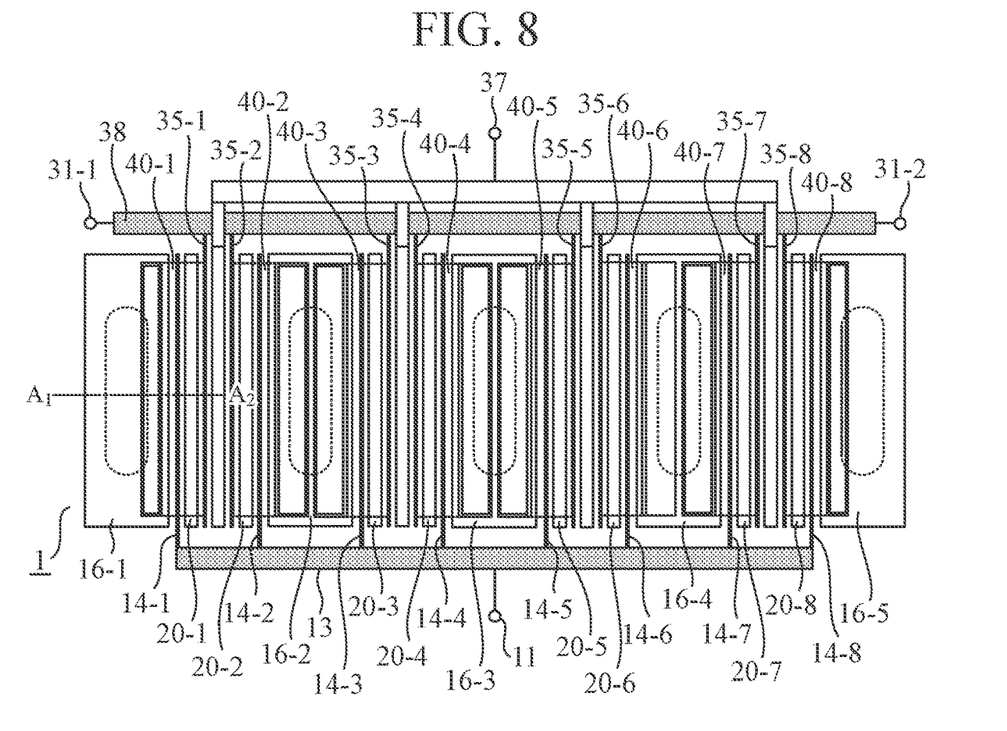
FIG. 8 is a configuration diagram illustrating yet another high-frequency amplifier 1 according to the first embodiment.

FIG. 8 is a configuration diagram illustrating yet another high-frequency amplifier 1 according to the first embodiment.

Figure 9:
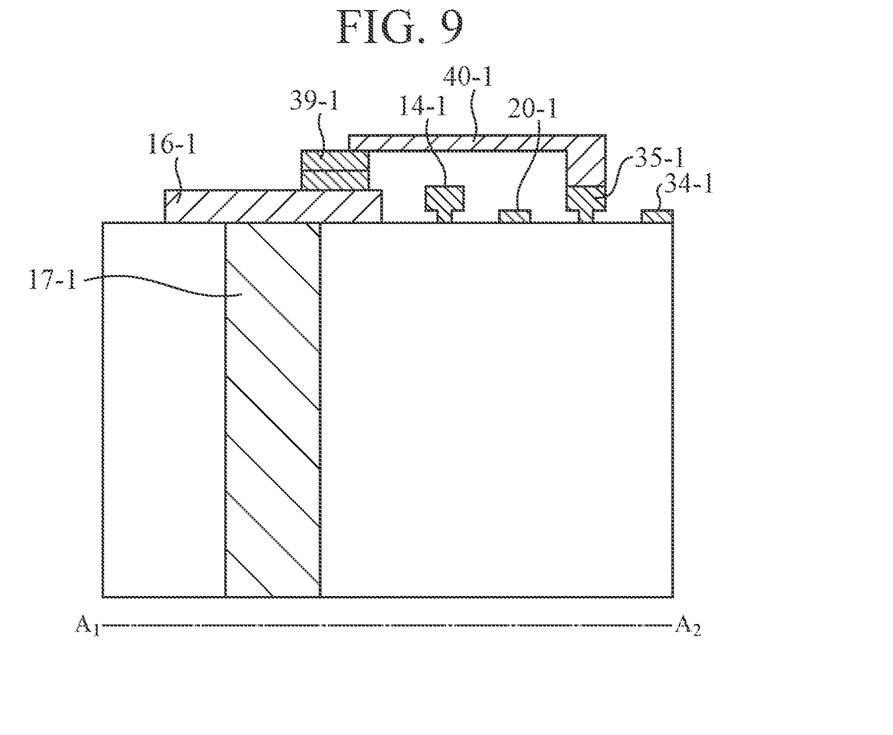
FIG. 9 is a cross-sectional view taken along line $A_1$-$A_2$ in FIG. 8.

FIG. 9 is a cross-sectional view taken along line $A_1$-$A_2$ in FIG. 8.

One end of the air bridge 40-$m$ ($m$=1, 2, . . . , 8) is connected to the gate finger 35-$m$, and the other end of the air bridge 40-$m$ is connected to one end of the capacitor 39-$m$.

In the configuration in which one end of the capacitor 39-$m$ is connected to the gate finger 35-$m$ via the air bridge 40-$m$, the parasitic component between the gate finger 35-$m$ and the capacitor 39-$m$ is smaller than that in the configuration in which one end of the capacitor 39-$m$ is connected to the gate bus bar 38.

Second Embodiment

Figure 10:
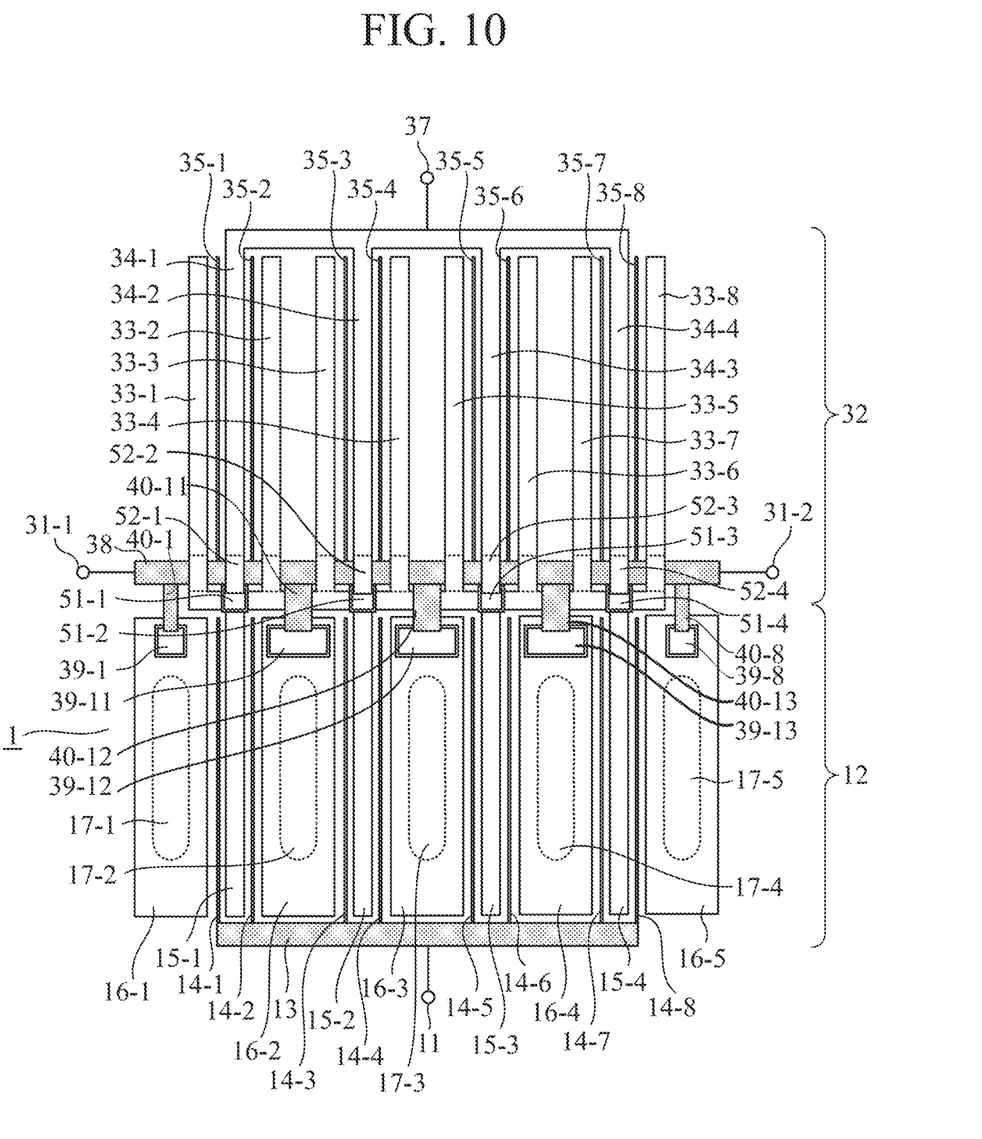
FIG. 10 is a configuration diagram illustrating a high-frequency amplifier 1 according to a second embodiment.

In a second embodiment, a high-frequency amplifier 1 including shunt feedback capacitors 51-1 to 51-4 will be described.

FIG. 10 is a configuration diagram illustrating the high-frequency amplifier 1 according to the second embodiment. In FIG. 10, the same reference numerals as those in FIGS. 3 and 6 denote the same or corresponding parts, and thus description thereof is omitted.

In the high-frequency amplifier 1 illustrated in FIG. 10, the shunt feedback capacitors 51-1 to 51-4 are applied to the high-frequency amplifier 1 illustrated in FIG. 6. However, this is only an example, and the shunt feedback capacitors 51-1 to 51-4 may be applied to the high-frequency amplifier 1 illustrated in FIG. 3.

Figure 11:
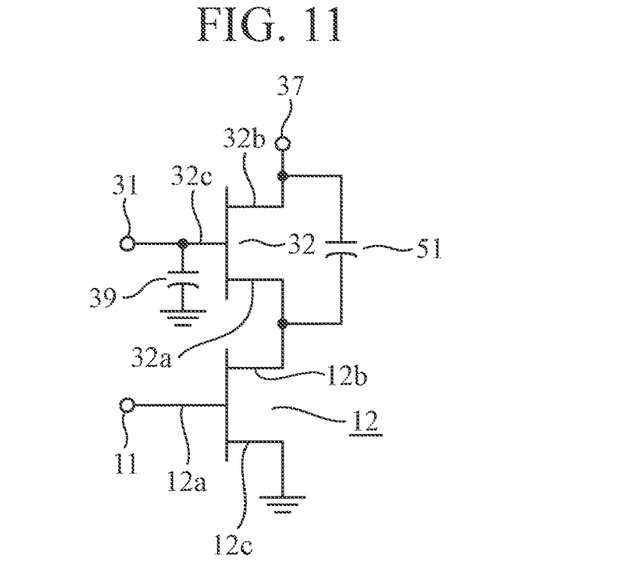
FIG. 11 is an equivalent circuit diagram illustrating the high-frequency amplifier 1 according to the second embodiment.

FIG. 11 is an equivalent circuit diagram illustrating the high-frequency amplifier 1 according to the second embodiment. In FIG. 11, the same reference numerals as those in FIG. 4 denote the same or corresponding parts, and thus description thereof is omitted.

The shunt feedback capacitor 51 is any one of the shunt feedback capacitors 51-1 to 51-4.

One end of the shunt feedback capacitor 51-$j$ ($j$=1, 2, 3, and 4) is connected to the drain finger 34-$j$ via an air bridge 52-$j$.

The other end of the shunt feedback capacitor 51-$j$ is connected to the drain finger 15-$j$.

One end of the air bridge 52-$j$ is connected to the drain finger 34-$j$, and the other end of the air bridge 52-$j$ is connected to one end of the shunt feedback capacitor 51-$j$.

As the high-frequency amplifier 1 includes the shunt feedback capacitors 51-1 to 51-4, impedance matching between the common-source transistor 12 and the common-gate transistor 32 can be implemented.

Since the shunt feedback capacitors 51-1 to 51-4 are arranged in a distributed manner for each of the drain fingers 15-$j$, an imbalanced operation of the drain fingers 15-1 to 15-4 is suppressed.

In the high-frequency amplifiers 1 illustrated in FIG. 10, the common-source transistor 12 and the common-gate transistor 32 are separate transistors. However, this is only an example, and for example, as illustrated in FIG. 12, it is possible to use a dual gate transistor in which the common-source transistor 12 and the common-gate transistor 32 are implemented in one transistor cell.

Figure 12:
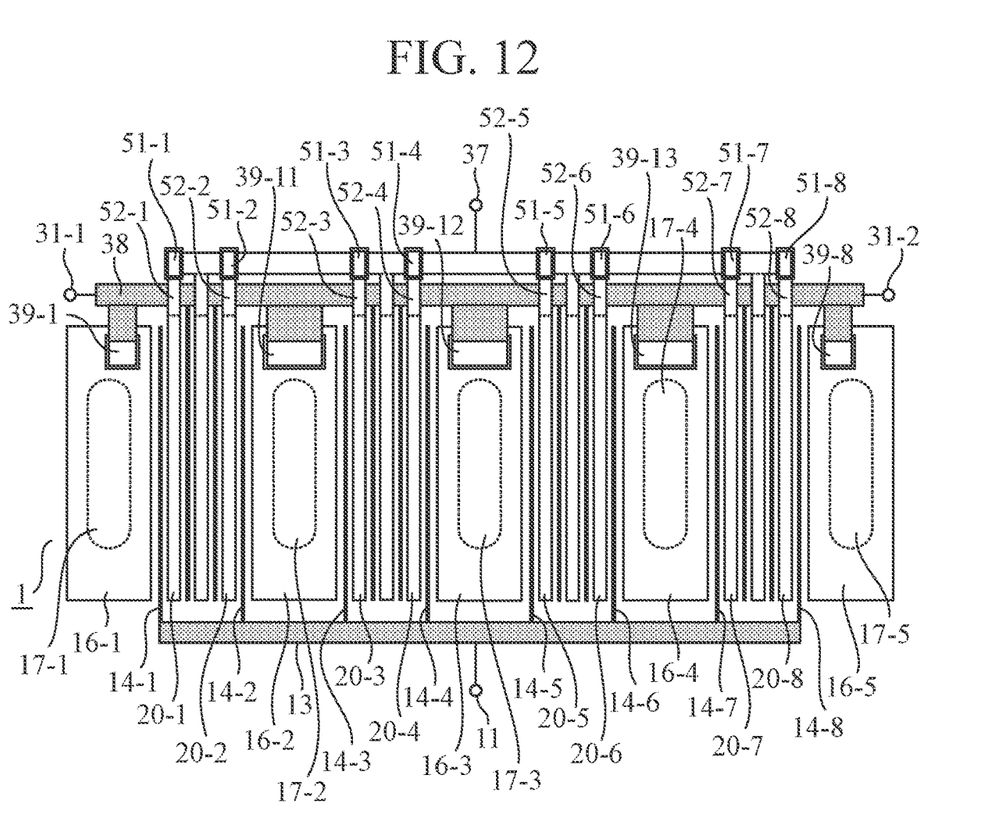
FIG. 12 is a configuration diagram illustrating another high-frequency amplifier 1 according to the second embodiment.

FIG. 12 is a configuration diagram illustrating another high-frequency amplifier 1 according to the second embodiment.

In the high-frequency amplifier 1 illustrated in FIG. 12, the gate fingers 14-1 to 14-8, the source fingers 16-1 to 16-5, the drain source fingers 20-1 to 20-8, the drain fingers 34-1 to 34-4, and the gate fingers 35-1 to 35-8 are arranged in parallel with each other.

The high-frequency amplifier 1 illustrated in FIG. 12 includes the capacitors 39-1, 39-8, 39-11, 39-12, and 39-13 similarly to the high-frequency amplifier 1 illustrated in FIG. 6, but may include the capacitors 39-1 to 39-8 similarly to the high-frequency amplifier 1 illustrated in FIG. 3.

When the common-source transistor 12 and the common-gate transistor 32 are implemented as a dual gate transistor, a high-frequency amplifier having a higher frequency or a wider band than the high-frequency amplifiers 1 illustrated in FIG. 10 can be implemented.

In the high-frequency amplifier 1 according to the first and second embodiments, the capacitors 39-1 to 39-8 or the capacitors 39-1, 39-8, 39-11, 39-12, and 39-13 are implemented by metal insulator metal (MIM) capacitors. The capacitors 39-1 to 39-8 and 39-11 to 39-13 are not limited to MIM capacitors, and may be implemented by, for example, interdigital capacitors.

In the high-frequency amplifier 1 according to the first and second embodiments, each of the capacitors 39-1 to 39-8 and the like is formed on any of the source fingers 16-1 to 16-5. However, this is only an example, and it is only required that each of the capacitors 39-1 to 39-8 and the like is disposed between each of the gate fingers 35-1 to 35-8 and each of the source fingers 16-1 to 16-5. Each of the capacitors 39-1 to 39-8 and the like may be formed on the gate bus bar 38 and then connected to the ground via an air bridge.

In the high-frequency amplifier 1 according to the first and second embodiments, each of the common-source transistor 12 and the common-gate transistor 32 is implemented by a GaN multi-finger transistor. However, this is only an example, and each of the common-source transistor 12 and the common-gate transistor 32 may be a transistor formed on a substrate whose material is GaAs (gallium arsenide) or the like.

Further, each of the common-source transistor 12 and the common-gate transistor 32 may be implemented by a bipolar transistor instead of a field effect transistor.

In the high-frequency amplifier 1 according to the first and second embodiments, each capacitor 39 is disposed at a position sandwiched between two gate fingers 14 or a position adjacent to one gate finger 14.

The capacitors 39-1 to 39-8 and the like are only required to be arranged at positions where the impedances obtained by looking toward the capacitor 39 from the respective gate fingers 35-$m$ are equal to each other, and are not limited to those arranged as illustrated in FIG. 3 or 5. For example, the capacitors 39 may be dispersedly arranged in every several gate fingers 14, and the effect of reducing the imbalance is obtained.

In the high-frequency amplifier 1 according to the first and second embodiments, the common-source transistor 12 and the common-gate transistor 32 are cascade-connected as two transistors. However, this is only an example, and three or more transistors may be cascade-connected.

Note that it is possible to freely combine the embodiments, modify any component of each embodiment, or omit any component of each embodiment in the present disclosure.

INDUSTRIAL APPLICABILITY

The present disclosure is suitable for a high-frequency amplifier that amplifies a high-frequency signal.

The present disclosure is suitable for a radio communication device including the high-frequency amplifier.

The present disclosure is suitable for a radar device including the high-frequency amplifier.

REFERENCE SIGNS LIST

1: High-frequency amplifier, 2: Transmission antenna, 3: Transmission antenna, 11: Signal input terminal, 12: Common-source transistor, 12a: Gate electrode, 12b: Drain electrode, 12c: Source electrode, 13: Gate bus bar, 14, 14-1 to 14-8: Gate finger, 15-1 to 15-4: Drain finger, 16-1 to 16-5: Source finger, 17-1 to 17-5: Via hole, 18: Bus bar, 20-1 to 20-8: Drain source finger, 31, 31-1, 31-2: Gate terminal, 32: Common-gate transistor, 32a: Source electrode, 32b: Drain electrode, 32c: Gate electrode, 33-1 to 33-8: Source finger, 34-1 to 34-4: Drain finger, 35-1 to 35-8: Gate finger, 36: Drain bus bar, 37: Signal output terminal, 38: Gate bus bar, 39, 39-1 to 39-8: Capacitor, 40-1 to 40-8: Air bridge, 51, 51-1 to 51-4: Shunt feedback capacitor, 52-1 to 52-4: Air bridge

The invention claimed is:

1. A high-frequency amplifier comprising:
a common-source transistor that has a plurality of gate fingers, a plurality of drain fingers, and a plurality of source fingers, amplifies a signal applied to each of the gate fingers as a signal to be amplified, and outputs an amplified signal from each of the drain fingers;
a common-gate transistor that has a plurality of source fingers connected to the drain fingers of the common-source transistor, a plurality of drain fingers, and a plurality of gate fingers, and amplifies the amplified signal output from each of the drain fingers of the common-source transistor;
a gate bus bar to be connected to the gate fingers of the common-gate transistor; and
a plurality of capacitors each having a first end connected to the gate bus bar and a second end grounded, wherein
the capacitors are arranged at respective positions where distances from the respective gate fingers of the common-gate transistor to the respective capacitors related to the respective gate fingers of the common-gate transistor are equal to each other, wherein impedances of the respective capacitors obtained at the respective gate fingers of the common-gate transistor are equal to each other,
each of the plurality of source fingers of the common-source transistor includes a source electrode with an individual source via (ISV) structure having a via hole,
each of the plurality of capacitors are provided on the source electrode of the respective source finger.

2. The high-frequency amplifier according to claim 1, wherein the capacitors have respective capacitances in which amplification operations of the gate fingers of the common gate transistor are in phase with each other.

3. The high-frequency amplifier according to claim 1, wherein the gate fingers of the common-source transistor, the drain fingers of the common-source transistor, and the source fingers of the common-source transistor are arranged in parallel with the source fingers of the common-gate transistor, the drain fingers of the common-gate transistor, and the gate fingers of the common-gate transistor.

4. A high-frequency amplifier comprising:
a common-source transistor that has a plurality of gate fingers, a plurality of drain fingers, and a plurality of source fingers, amplifies a signal applied to each of the gate fingers as a signal to be amplified, and outputs an amplified signal from each of the drain fingers;
a common-gate transistor that has a plurality of source fingers connected to the drain fingers of the common-source transistor, a plurality of drain fingers, and a plurality of gate fingers, and amplifies the amplified signal output from each of the drain fingers of the common-source transistor;
a gate bus bar to be connected to the gate fingers of the common-gate transistor; and
a plurality of capacitors each having a first end and a second end, the second end being grounded, wherein
the capacitors are arranged at respective positions where distances from the respective gate fingers of the common-gate transistor to the respective capacitors related to the respective gate fingers of the common-gate transistor are equal to each other, wherein impedances of the respective capacitors obtained at the respective gate fingers of the common-gate transistor are equal to each other,
each of the capacitors is disposed between a respective one of the gate fingers of the common-gate transistor and a respective one of the source fingers of the common-source transistor,
each of the source fingers of the common-source transistor is a source electrode with an individual source via (ISV) structure having a via hole,
each of the capacitors are provided on the respective source electrode,
the high-frequency amplifier further includes drain source fingers, which are fingers in which the drain fingers of the common-source transistor and the source fingers of the common-gate transistor are integrated, and
the gate fingers of the common-source transistor, the source fingers of the common-source transistor, the drain source fingers, the drain fingers of the common-gate transistor, and the gate fingers of the common-gate transistor are arranged in parallel with each other.

5. The high-frequency amplifier according to claim 1, further comprising a plurality of shunt feedback capacitors having first ends connected to the respective drain fingers of the common-gate transistor and second ends connected to the respective drain fingers of the common source transistor.

6. A radio communication device comprising the high-frequency amplifier according to claim 1.

7. A radar device comprising the high-frequency amplifier according to claim 1.

* * * * *